(12) United States Patent
Mun

(10) Patent No.: US 9,171,635 B2
(45) Date of Patent: Oct. 27, 2015

(54) SEMICONDUCTOR MEMORY DEVICE HAVING PAGE BUFFER AND METHOD OF OPERATING THE SAME

(75) Inventor: Kyung Sik Mun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 547 days.

(21) Appl. No.: 13/603,187

(22) Filed: Sep. 4, 2012

(65) Prior Publication Data

US 2014/0036599 A1 Feb. 6, 2014

(30) Foreign Application Priority Data

Aug. 2, 2012 (KR) ........................ 10-2012-0084694

(51) Int. Cl.
*G11C 16/04* (2006.01)
*G11C 16/34* (2006.01)
*G11C 16/24* (2006.01)

(52) U.S. Cl.
CPC ............ *G11C 16/3459* (2013.01); *G11C 16/24* (2013.01); *G11C 16/0483* (2013.01)

(58) Field of Classification Search
CPC ............... G11C 16/0483; G11C 16/24; G11C 16/3454–16/3463
USPC .................................................... 365/185.22
See application file for complete search history.

(56) References Cited

U.S. PATENT DOCUMENTS

| | | | | |
|---|---|---|---|---|
| 7,301,816 | B2 * | 11/2007 | Li et al. ........................ | 365/185.2 |
| 2002/0006063 | A1 * | 1/2002 | Sato et al. ................. | 365/189.11 |
| 2007/0291566 | A1 * | 12/2007 | Mokhlesi et al. ............ | 365/212 |
| 2008/0247240 | A1 * | 10/2008 | Lee ........................... | 365/185.22 |
| 2008/0298133 | A1 * | 12/2008 | Kim et al. ................. | 365/185.22 |
| 2009/0040835 | A1 * | 2/2009 | Ogawa ...................... | 365/185.21 |
| 2009/0244978 | A1 * | 10/2009 | Yoshihara et al. ........ | 365/185.21 |
| 2010/0054045 | A1 * | 3/2010 | Ho et al. .................. | 365/189.05 |
| 2010/0284227 | A1 * | 11/2010 | Choi et al. ............... | 365/185.22 |
| 2010/0302852 | A1 * | 12/2010 | Oh ........................... | 365/185.12 |
| 2010/0329005 | A1 * | 12/2010 | Yang ......................... | 365/185.03 |
| 2011/0292736 | A1 * | 12/2011 | Honda ...................... | 365/185.21 |
| 2013/0155777 | A1 * | 6/2013 | Chen et al. ............... | 365/185.25 |

* cited by examiner

*Primary Examiner* — Vanthu Nguyen
*Assistant Examiner* — Khamdan Alrobaie
(74) *Attorney, Agent, or Firm* — IP & T Group LLP

(57) ABSTRACT

The semiconductor memory device includes a memory cell array including a plurality of cell transistors, and a page buffer configured to perform an verification operation for verifying a program state of a selected cell transistor by sensing a voltage of a sense node connected to a selected bit line of the memory cell array through a bit line selection transistor, wherein a logic level corresponding to a voltage of the selected bit line is constantly maintained regardless of the program state of the selected cell transistor during the verification operation.

15 Claims, 6 Drawing Sheets

SEMICONDUCTOR MEMORY DEVICE HAVING PAGE BUFFER AND METHOD OF OPERATING THE SAME

CROSS-REFERENCE TO RELATED APPLICATION

This application is based on and claims priority from Korean Patent Application No. 10-2012-0084694, filed on Aug. 2, 2012, with the Korean Intellectual Property Office, the disclosure of which is incorporated herein in its entirety by reference.

BACKGROUND

The present invention relates to a semiconductor device and a method of operating the semiconductor device.

A semiconductor memory device includes a memory cell array which includes a plurality of memory cells. A connection relation or an arrangement method of the memory cells is varied depending on the type of semiconductor memory device. For example, in a NAND flash memory device, the memory cells are connected in series to constitute a cell string, and the cell string is connected between a bit line and a common source line.

FIG. 1 schematically illustrates a cell string 120 and a page buffer 110 connected to the cell string 120 of a NAND flash memory device in the related art, and FIG. 2 schematically illustrates a read operation of the page buffer 110 illustrated in FIG. 1.

Referring to FIGS. 1 and 2, the page buffer 110 includes a PMOS transistor MP pre-charges a sense node SO in response to a pre-charge bar signal PRECHb, an NMOS transistor MN selectively connects a bit line BL to the sense node SO in response to a bit line signal BSL, and a latch 112 temporally store data corresponding to a potential of the sense node SO. The page buffer 110 is connected to a cell string 120 through the bit line BL.

The cell string 120 includes a plurality of cell transistors MC1 to MCn. When a read voltage is applied to a word line WL2 and data stored in a selected memory cell MC2 is read, the page buffer 110 verifies the data stored in the selected memory cell MC2 as follows.

First, the sense node SO is pre-charged with a voltage PB_VREF, and then, a drain selection transistor DST, a source selection transistor SST, and the remaining cell transistors MC1 and MC3 to MCn, except for the selected cell transistor MC2, included in the cell string 120 are all turned on. Accordingly, when the selected cell transistor MC2 is turned on according to a voltage applied to the word line WL2, a current path is formed, so that a bit line current IBL flows. Particularly, when the selected memory cell MC2 is in a program state, the cell transistor MC2 is in an off state, so that a voltage level of the sense node SO is constantly maintained in the pre-charge voltage PB_VREF. When the selected memory cell MC2 is in an erase state, the cell transistor MC2 is turned on and thus a discharging current IBL flows, thereby decreasing the voltage level of the sense node SO. According to the voltage level of the sense node SO, data is stored in the latch 112.

When a voltage level of the bit line BL is decreased in the read operation, the current IBL flowing through the bit line BL, i.e., the current flowing through the selected memory cell MC2, may be decreased. As a result, there are some concerns that a threshold voltage of the selected memory cell MC2 may be verified to be larger than an actual threshold voltage, thereby finally resulting in malfunction of the semiconductor memory device.

SUMMARY

The present invention has been made in an effort to provide a semiconductor memory device capable of improving an operation characteristic and a method of operating the semiconductor memory device.

An exemplary embodiment of the present invention provides a semiconductor memory device including: a memory cell array including a plurality of cell transistors; and a page buffer configured to perform a verification operation for verifying a program state of a selected cell transistor by sensing a voltage of a sense node connected to a selected bit line of the memory cell array through a bit line selection transistor, wherein a logic level corresponding to a voltage of the selected bit line is constantly maintained regardless of the program state of the selected cell transistor during the verification operation.

Another exemplary embodiment of the present invention provides a method of operating a semiconductor memory device, including: precharging a selected bit line and a sense node connected to the selected bit line; providing charges from the sense node to the selected bit line when charges precharged with the selected bit line are emitted according to data of a cell transistor; and verifying the data of the cell transistor by sensing a voltage of the sense node.

Yet another exemplary embodiment of the present invention provides a semiconductor memory device including: a memory cell array including a plurality of cell transistors; and a page buffer configured to verify a program state of a selected cell transistor by sensing a voltage of a sense node connected to a selected bit line of the memory cell array through a bit line selection transistor, wherein the bit line selection transistor is turned on to precharge the selected bit line, and the bit line selection transistor is maintained in a turn-on state until the program state of the selected cell transistor is latched.

According to the exemplary embodiments of the present invention, it may be possible to improve an operation characteristic of a semiconductor memory device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
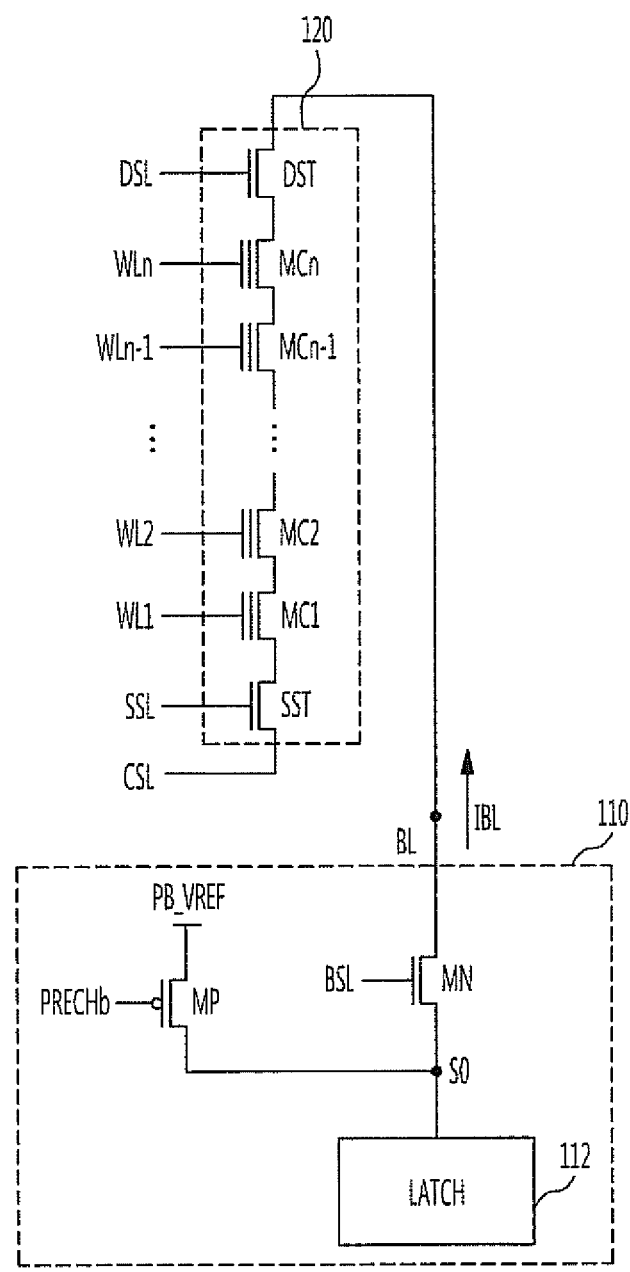
FIG. 1 is a schematic diagram illustrating a cell string and a page buffer of a NAND flash memory device in the related art.

The present invention, an operational advantage of the present invention, and an object achieved through the implementation of the present invention will be fully understood through the reference of the accompanying drawings exemplifying an exemplary embodiment of the present invention and contents described in the drawings.

The embodiment is provided only for illustrative purposes and for full understanding of the scope of the present invention by those skilled in the art. However, the present invention is not limited to an embodiment disclosed below and may be implemented in various forms. Rather, the exemplary embodiment is provided to more sincerely and fully disclose the present invention and to completely transfer the spirit of the present invention to those skilled in the art to which the present invention pertains.

Hereinafter, an exemplary embodiment of the present invention will be described with reference to the accompanying drawings in detail.

Figure 3:
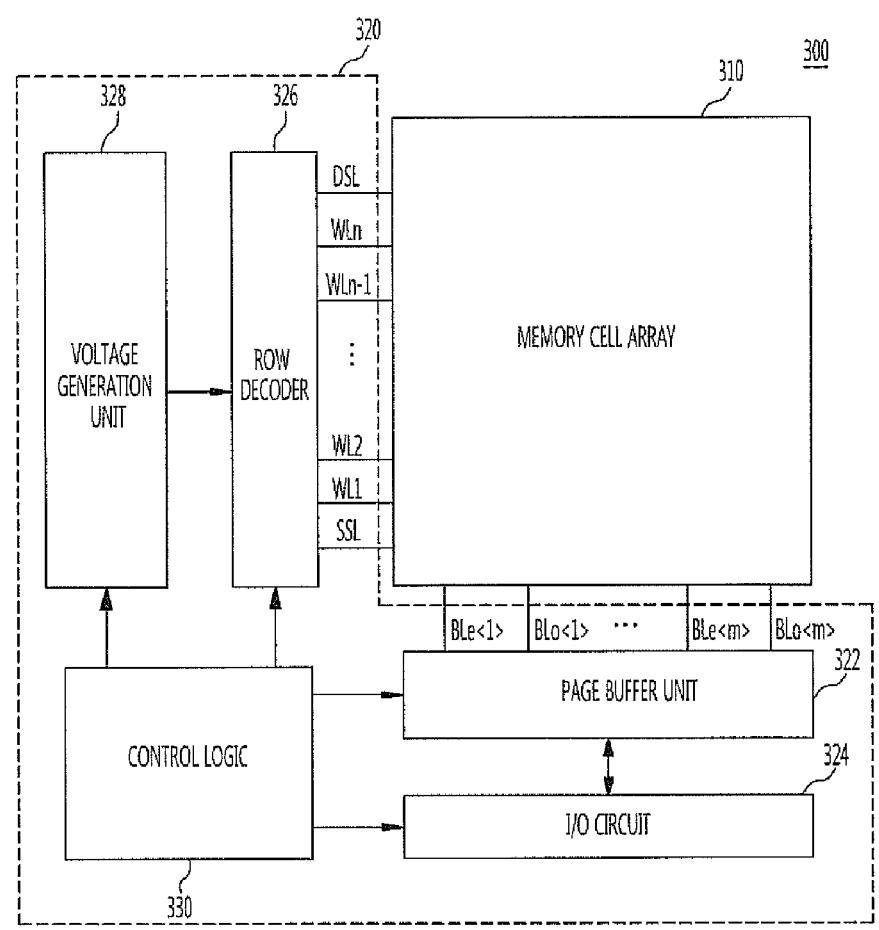
FIG. 3 a block diagram showing a semiconductor memory device according to an exemplary embodiment of the present invention.

FIG. 3 illustrates a semiconductor memory device according to an exemplary embodiment of the present invention.

Referring to FIG. 3, a semiconductor memory device 300 includes a memory cell array 310 and a peripheral circuit 320. According to the exemplary embodiment, as illustrated in FIG. 3, the peripheral circuit 320 includes a page buffer unit 322, an I/O circuit 324, a row decoder 326, a voltage generation unit 328, and a control logic 330.

The memory cell array 310 is a data storage region of the semiconductor memory device 300, and includes cell transistors (not shown) connected to bit lines BLe and BLo and word lines WL. Each cell transistor (not shown) may store single bit data or multi bit data. The cell transistor storing the single bit data is referred to as a Single Level Cell (SLC), and the cell transistor storing the multi bit data of two or more bits is referred to as a Multi Level Cell (MLC). The SLC has an erase state and one program state according to a threshold voltage. The MLC has an erase state and multiple program states according to a threshold voltage. The MLC is programmed in any one voltage in a distribution of a plurality of threshold voltages in order to store multiple bits in one cell.

The page buffer unit 322 is connected to the memory cell array 310 through even bit lines BLe<1> to BLe<m> and odd bit lines BLo<1> to BLo<m>. The page buffer unit 322 is operated in response to a control of the control logic 330.

The page buffer unit 322 is operated as a write driver or a sense amplifier according to an operation mode. For example, the page buffer unit 322 is operated as the sense amplifier in a read operation mode and the write driver in a program operation mode. The read operation means an operation of reading data stored in selected cell transistors by sensing threshold voltages of the selected cell transistors. The program operation may mean an operation of storing data in such a manner that the selected cell transistors have threshold voltages corresponding data to be stored.

The program operation may include a program section and a verification section. In the program section, the page buffer unit 322 receives data to be programmed from the I/O circuit 324 and stores the data in internal latches (not shown). The page buffer unit 322 may provide a ground voltage to the bit lines BLe and BLo connected to the programmed cell transistors. Further, the page buffer unit 322 may provide a program inhibition voltage to the bit lines BLe and BLo connected to the program-inhibited cell transistors. In the verification section, the threshold voltages of the cell transistors are sensed likewise to the read operation. According to the sensed threshold voltage, whether the desired data is normally programmed may be verified. The program section and the verification section may be repeatedly performed until the desired data is normally programmed.

The I/O circuit 324 may transfer an address, program data, and a command input through an input/output terminal (not shown). The I/O circuit 324 may transfer the address to an address buffer (not shown), the program data to the page buffer unit 322, and the command to a command register (not shown). In the read operation, the read data provided from the page buffer unit 322 may be output to the outside through the I/O circuit 324.

The row decoder 326 selects word lines WL according to the address. The row decoder 326 is operated in response to a control of the control logic 330. The row decoder 326 may include the address buffer. The row decoder 326 transfers various word line voltages provided from the voltage generation unit 328 to the word lines WL based on the address. In the program operation, the row decoder 326 transfers the program voltage to a selected word line and a program pass voltage to a non-selected word line. In the read operation, the row decoder 326 provides a read voltage provided from the voltage generation unit 328 to a selected word line and a read pass voltage to a non-selected word line.

The voltage generation unit 328 may provide general voltages for the program of the semiconductor memory device 300. The voltage generation unit 328 is operated in response to a control of the control logic 330. The voltage generation unit 328 may be configured so as to include a plurality of pumping capacitors and generate multiple voltages by using the plurality of pumping capacitors.

The control logic 330 is configured to receive a command and control a general operation of the semiconductor memory device 300 according to the received command. The control logic 330 may include a command register (not shown).

Figure 4:
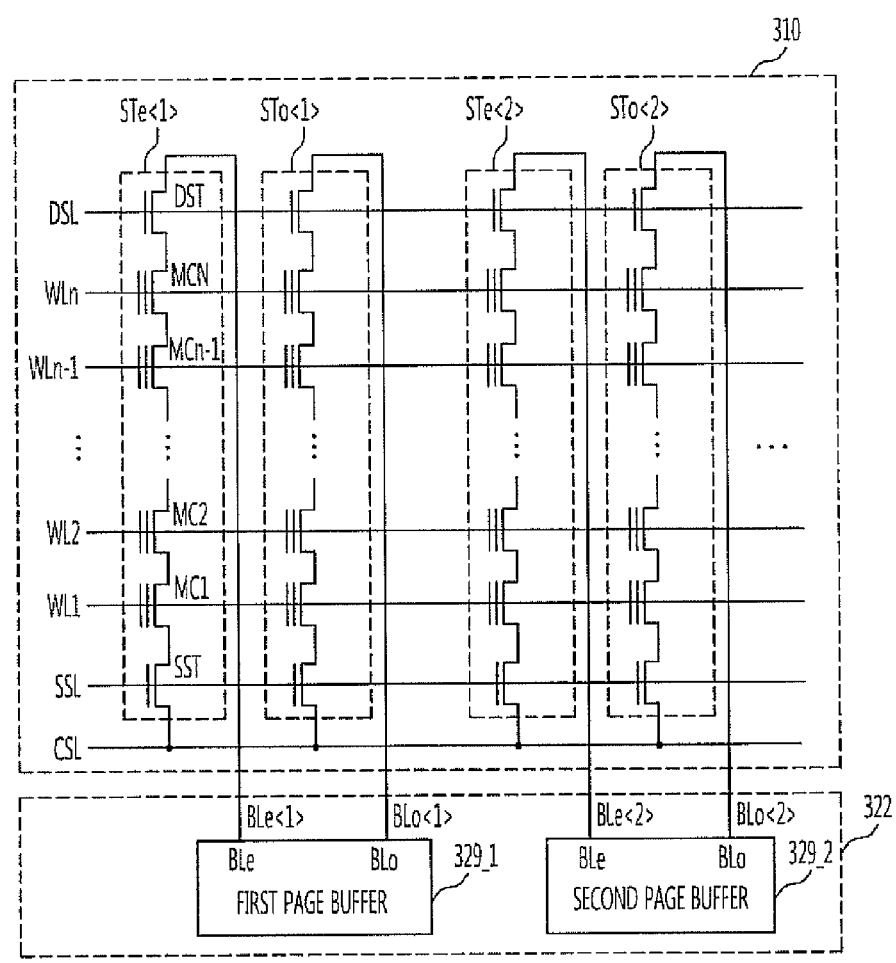
FIG. 4 is a diagram illustrating a part of a memory cell array and a page buffer unit illustrated in FIG. 3.

FIG. 4 is a block diagram illustrating a part of the memory cell array 310 and the page buffer unit 322 illustrated in FIG. 3.

Referring to FIG. 4, the memory cell array 310 includes a plurality of cell strings STe and STo connected to the corresponding bit lines BLe and BLo. For the convenience of description, FIG. 4 illustrates only four cell strings STe<1>, STo<1>, STe<2>, and STo<2>. Each cell string includes a drain selection transistor DST connected to the even bit line or the odd bit line BLo, a source selection transistor SST connected to a common source line CSL, and a plurality of cell transistors MC arranged in series between the drain selection transistor DST and the source selection transistor SST. A gate of the drain selection transistors is connected to the drain selection line DSL, a gate of the source selection transistors is connected to the source selection line SSL, and a control gate of each memory cell MC is connected to a corresponding word line WL.

The drain selection transistor DST and the source selection transistor SST may be general MOS transistors, and the plurality of cell transistors MC may be transistors including a charge storing layer, such as a floating gate or a charge trap layer.

The page buffer unit 322 includes a plurality of page buffers 329_1 and 329_2. FIG. 4 illustrates only two page buffers 329_1 and 329_2 for the illustrative purpose. Each page buffer is connected to the memory cell array 310 through a pair of corresponding bit lines, i.e. the even bit line (e.g., BLeI) and the odd bit line (e.g., BLo).

Figure 5:
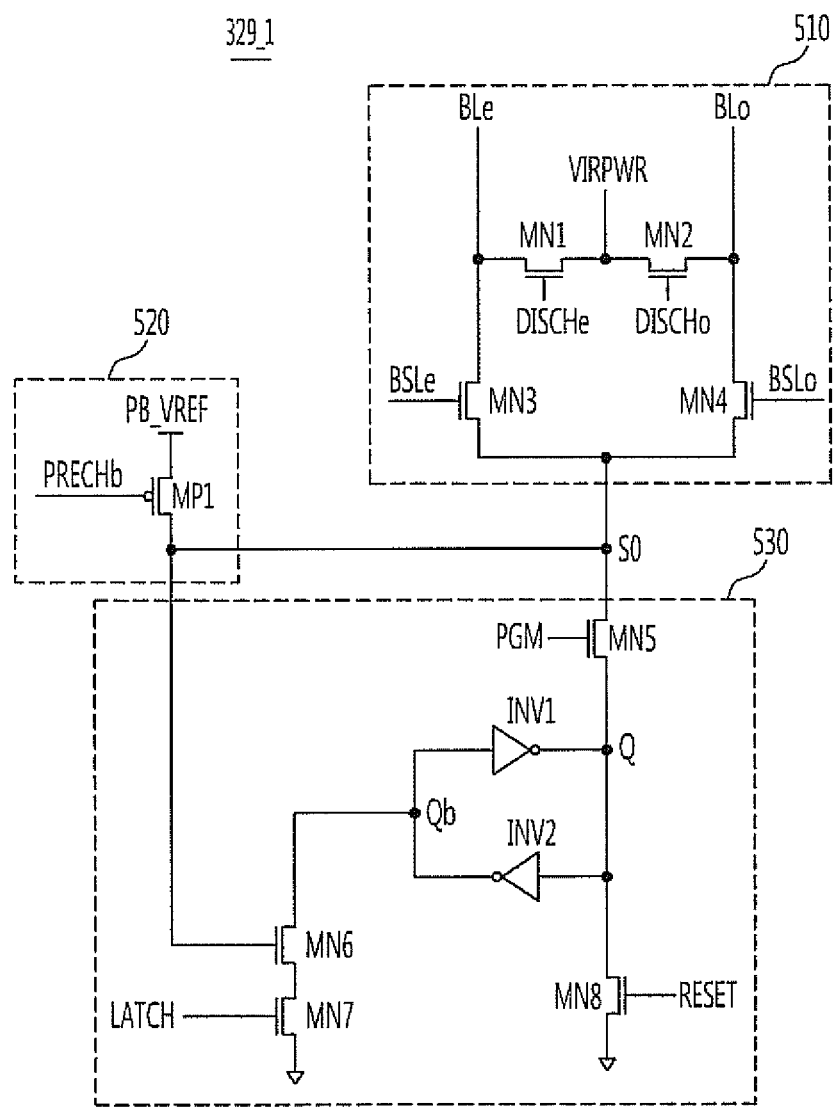
FIG. 5 is a circuit diagram illustrating one embodiment of one of page buffers illustrated in FIG. 4.

FIG. 5 is a circuit diagram illustrating one embodiment of one page buffer 329_1 between the page buffers 329_1 and 329_2 illustrated in FIG. 4.

Referring to FIG. 5, the page buffer 329_1 includes a bit line selection unit 510, a precharge unit 520, and a latch unit 530.

The bit line selection unit 510 includes a first NMOS transistor MN1 configured to discharge the even bit line BLe with a voltage VIRPWR in response to a first discharging signal DISe, a second NMOS transistor MN2 configured to discharge the odd bit line BLo with the voltage VIRPWR in response to a second discharging signal DISo, a third NMOS transistor MN3 configured to connect the even bit line BLe to the sense node SO in response to a first bit line selection signal BSLe, and a fourth NMOS transistor M4 configured to connect the odd bit line BLo to the sense node SO in response to a second bit line selection signal BSLo.

The precharge unit 520 includes a PMOS transistor MP1 configured to precharge the sense node SO with a voltage PB_VREF in response to a precharge bar signal PRECHb.

The latch unit 530 includes inverters INV1 and INV2 and a plurality of transistors MN5 to MN8. The first inverter INV1 and the second inverter INV2 are connected in parallel in an opposite direction to constitute a latch. A fifth NMOS transistor MN5 is interposed between the sense node SO and an output node Q of the latch and is turned on in response to a signal PGM. A sixth NMOS transistor MN6 is turned on according to a voltage of the sense node SO, and a seventh NMOS transistor MN7 is turned on in response to a latch signal LATCH. An eighth NMOS transistor MN8 is turned on according to a reset signal RESET to initialize the node Q.

Figure 6:
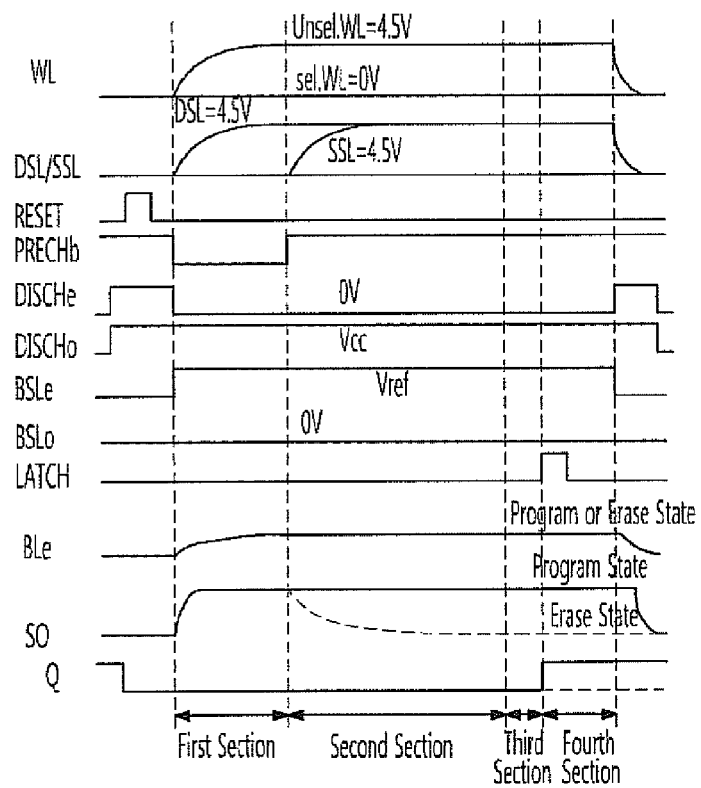
FIG. 6 is a timing diagram illustrating a read operation of a page buffer illustrated in FIG. 5.

FIG. 6 schematically illustrates a read operation of the page buffer 329_1 illustrated in FIG. 5.

A process of reading data at the page buffer 329_1 illustrated in FIG. 5 will be described with reference to FIG. 6. Hereinafter, a case in which data stored in a memory cell connected to the even bit line BLe is read will be described as an example.

First, the drain selection signal DSL in a high logic level is applied in the first section, so that the drain selection transistor DST of FIG. 4 is turned on. Further, the precharge bar signal PRECHb in a low logic level is applied to the precharge unit 520 in the first section, so that the PMOS transistor MP1 is turned on. Accordingly, the sense node SO is precharged with the voltage PB_VREF, i.e., the low logic level. For example, the voltage PB_VREF may be 5 V. In the meantime, the first bit line selection signal BSLe in a high logic level is applied to the bit line selection unit 510 in the first section so that the third NMOS transistor MN3 is turned on, and as a result, the sense node SO and the even bit line BLe is connected to each other. A threshold voltage of the third NMOS transistor MN3 may be 1 V, and a voltage Vref applied to the gate of the third NMOS transistor MN3 in the first section may be 2 V. Accordingly, the even bit line BLe connected with the sense node SO through the third NMOS transistor MN3 in the first section is precharged with 1 V that is a difference between the voltage of 2 V applied to the gate and the threshold voltage of 1V.

The precharge bar signal PRECHb in a high logic level is applied in the second section, so that the PMOS transistor MP1 is turned off, and as a result, the sense node SO is momentarily floated in a state of having a voltage PB_REF. The first bit line selection signal BSLe is continuously maintained in the high logic level, so that the third NMOS transistor MN3 is maintained in a turn-on state. Further, the source selection signal SSL in a low logic level is applied, so that the source selection transistor SST of FIG. 4 is turned on. Because the source selection transistor SST of FIG. 4 is turned on, a current path may be formed between the sense node SO and the common source line CSL according to an on or off state of the selected cell transistor MC2 of FIG. 4. When it is assumed that the selected cell transistor MC2 of FIG. 4 is turned on due to the erase state, a current path is formed between the sense node SO and the common source line CSL, so that a discharging current flows. Accordingly, a potential of the sense node SO in the floating state is dropped.

In the meantime, the even bit line BLe and the sense node SO are connected through the third NMOS transistor MN3 in the second section. As described before, when the potential of the sense node SO is 5 V and the voltage of 2 V has been applied to the gate of the third NMOS transistor MN3 having the threshold voltage of 1 V, the potential of the even bit line BLe is continuously maintained in 1 V until the potential of the sense node SO is dropped up to 1 V even though the discharging current flows. Accordingly, even though the discharging current flows in the second section and the potential of the sense node SO is discharged to be dropped, but the potential of the even bit line BLe is constantly maintained.

Specifically, when the potential of the even bit line BLe is slightly decreased in a level lower than 1 V during the flow of the discharging current, the third NMOS transistor MN3 is turned on, and then the even bit line BLe receives charges from the sense node SO and restores the potential into 1 V again. When the potential of the even bit line BLe is slightly increased in a level higher than 1V for receiving the charges from the sense nod SO, the third NMOS transistor MN3 is turned off, and then the potential of the even bit line BLe is decreased again. Such a process is repeated until the potential of the sense node SO is dropped to 1 V in a condition that the third NMOS transistor MN3 is in the turn-on state.

A difference between the read operation of the semiconductor memory device in the related art and the read operation of the semiconductor memory device according to the exemplary embodiment of the present invention will be summarized with reference to FIGS. 2 to 6.

Figure 2:
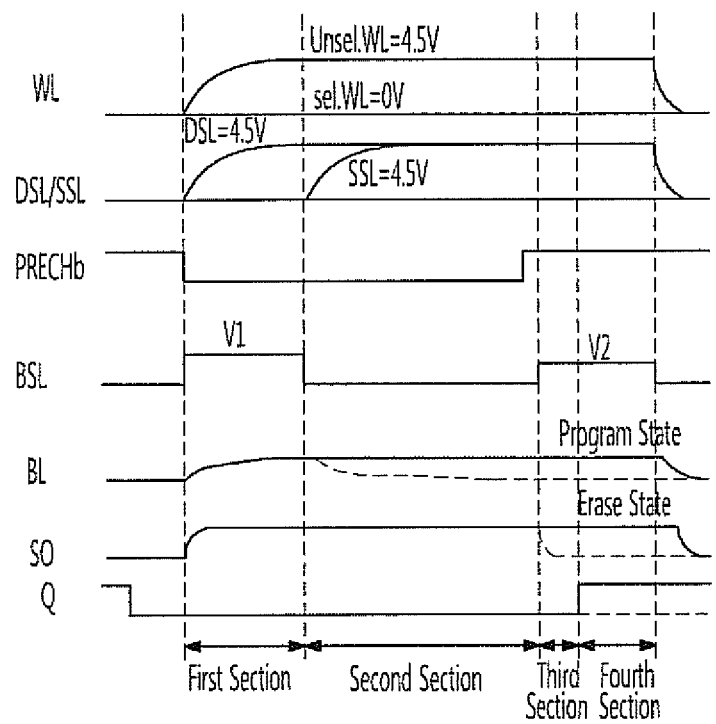
FIG. 2 is a timing diagram illustrating a read operation of the page buffer illustrated in FIG. 1.

In the related art, a level of the bit line selection signal BSL of FIG. 2 is changed in the read operation. Particularly, referring to FIG. 2, the level of the bit line selection signal BSL is changed to level V1 in the first section, a ground level in the second section, and level V2 in the third section during the read operation. Accordingly, the turn-on state and the turn-off state of the third NMOS transistor MN3 is repeated in the first to fourth sections. However, referring to FIG. 6, the bit line selection signal BSLe of the semiconductor memory device according to the exemplary embodiment of the present invention is maintained in the high logic level in the first to fourth sections of the read operation so that the third NMOS transistor MN3 is maintained in the turn-on state.

Referring to FIG. 2, the potential of the bit line BL in the related art is discharged and dropped in the second section. On the contrary, referring to FIG. 6, the potential of the even bit line BLe of the semiconductor memory device according to the exemplary embodiment of the present invention is maintained in the high logic level in the first to fourth sections of the read operation.

In the semiconductor memory device 300 according to the exemplary embodiment of the present invention, the voltage of the selected bit line is constantly maintained regardless of the program state of the selected cell transistor in the read operation or the verification operation for verifying the program state of the selected cell transistor, so that the operation characteristic is improved.

The semiconductor memory device 300 according to the exemplary embodiment of the present invention may further include a separate capacitor connected to the sense node SO in order to increase a capacitance of the sense node SO. For example, the adjacent bit line capacitance may be connected. As the capacitance of the sense node SO is larger, more charges may be charged in the sense node SO in the precharge step. Accordingly, a capability of supplying the charge to the bit line BLe is improved during the discharging in the read operation, so that the potential of the bit line BLe is effectively constantly maintained without being dropped.

The precharge voltage PB_VReF provided to the sense node SO may be provided from the voltage generation unit 328 (see FIG. 3). As the precharge voltage PB_VREF is higher, more charges may be charged in the sense node SO in the precharge step. Accordingly, a capability of supplying the charge to the bit line BLe is improved during the discharging of the bit line BLe in the read operation, so that the potential of the bit line BLe is effectively constantly maintained without being dropped.

Figure 7:
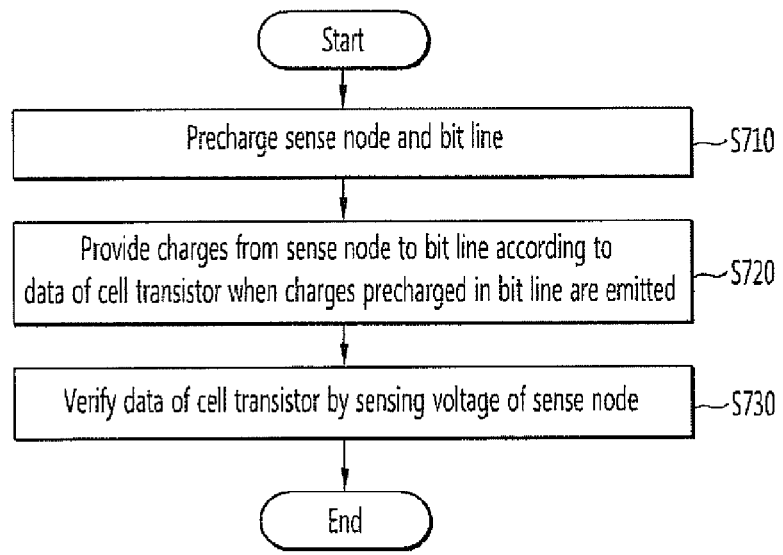
FIG. 7 is a flow chart showing a method of operating a semiconductor memory device according to another exemplary embodiment of the present invention.

FIG. 7 is a flowchart illustrating the read operation according to an exemplary embodiment of the present invention.

Referring to FIGS. 5 and 7, the sense node SO and the selected bit line BLe is precharged in step S710. As described before with reference to FIG. 6, when the sense node SO is precharged by the precharge unit 520, the bit line selection transistor MN3 is turned on, so that the sense node SO and the bit line BLe may be precharged.

In step S720, when the charges precharged in the bit line BLe is emitted to the common source line CSL (see FIG. 4) according to the data of the selected cell transistor (e.g., the cell transistor MC2 of FIG. 4), the charges is provided to the bit line BLe from the sense node SO.

The voltage of the bit line BLe may be constantly maintained by the emission of the charges through the cell string connected to the bit line BLe to the common source line CSL and the supply of the charges from the sense node SO to the bit line BLe. In the meantime, the charges of the sense node SO are supplied to the bit line BLe, so that the voltage of the sense node SO may be decreased. As a result, the voltage of the bit line BLe is constantly maintained, but the voltage of the sense node SO may be changed according to the data of the selected cell transistor. In this case, the bit line selection signal BSLe may be maintained in the high logic level in order to supply the charges to the bit line BLe from the sense node SO.

As described above, when the threshold voltage of the bit line selection transistor MN3 is 1 V and the voltage of the bit line selection signal BSLe applied to the gate of the bit line selection transistor MN3 is maintained in 2 V, the bit line BLe may be maintained in 1 V that is difference between the voltage of the bit line selection signal BSLe and the threshold voltage of the bit line selection transistor MN3.

In step S730, the data of the cell transistor is verified by sensing the voltage of the sense node SO.

As described above, the exemplary embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor memory device, comprising:
   a memory cell array comprising a plurality of cell transistors; and
   a page buffer configured to perform a verification operation for verifying a program state of a selected cell transistor by sensing a voltage of a sense node connected to a selected bit line of the memory cell array through a bit line selection transistor,
   wherein the page buffer electrically couples the sense node to a power source to precharge the sense node, electrically decouples the sense node from the power source, and senses the voltage of the sense node when a current path from the sense node to the selected bit line is formed according to the program state of the selected cell transistor,
   wherein a first voltage applied to a gate terminal of the bit line selection transistor is constantly maintained until the voltage of the sense node is sensed,
   wherein the sense node is precharged with a second voltage by electrically coupling the sense node to the power source and electrically decoupled from the power source until the voltage of the sense node is sensed, and
   wherein the second voltage is higher than the first voltage so that a voltage of the selected bit line is constantly maintained regardless of the program state of the selected cell transistor until the voltage of the sense node is sensed.

2. The semiconductor memory device of claim 1, wherein the selected bit line is precharged with a third voltage.

3. The semiconductor memory device of claim 2, wherein the second voltage is higher than the third voltage.

4. The semiconductor memory device of claim 3, wherein the third voltage corresponds to a difference between the first voltage and a threshold voltage of the bit line selection transistor.

5. The semiconductor memory device of claim 4, further comprising a capacitor connected to the sense node.

6. The semiconductor memory device of claim 4, further comprising a charge pump configured to provide the second voltage to the power source.

7. The semiconductor memory device of claim 2, wherein the first voltage is applied from when the selected bit line is precharged with the third voltage until the selected bit line is discharged with a fourth voltage.

8. The semiconductor memory device of claim 1, wherein the page buffer comprises:
   a bit line selection unit configured to couple an even bit line or an odd bit line to the sense node in response to a bit line selection signal;
   a precharge unit configured to precharge the sense node in response to a precharge signal; and
   a latch unit configured to store data corresponding to the voltage of the sense node in response to a latch signal.

9. The semiconductor memory device of claim 8, wherein the bit line selection signal has a constant logic level during the verification operation.

10. The semiconductor memory device of claim 8, wherein the bit line selection unit comprises:
    a first transistor configured to couple the even bit line to the sense node in response to the bit line selection signal; and
    a second transistor configured to couple the odd bit line to the sense node in response to a reversal signal of the bit line selection signal.

11. The semiconductor memory device of claim 10, wherein the bit line selection signal is maintained in a first logic level and the reversal signal of the bit line selection signal is maintained in a second logic level during the verification operation.

12. A method of operating a semiconductor memory device, comprising:
   precharging a selected bit line and a sense node connected to the selected bit line, by electrically coupling the sense node to a power source and by applying a first voltage to a gate terminal of a bit line selection transistor coupled between the sense node and the selected bit line;
   providing charges from the sense node to the selected bit line according to data of a cell transistor; and
   verifying the data of the cell transistor by sensing a voltage of the sense node,
   wherein the first voltage is constantly maintained during the providing of the charges from the sense node to the selected bit line and verifying of the data of the cell transistor,
   wherein the sense node is precharged with a second voltage by electrically coupling the sense node to the power source and electrically decoupled from the power source during the providing of the charges from the sense node to the selected bit line and verifying of the data of the cell transistor, and
   wherein the second voltage is higher than the first voltage so that a voltage of the selected bit line is constantly maintained regardless of the data of the cell transistor during the providing of the charges from the sense node to the selected bit line and verifying of the data of the cell transistor.

13. The method of claim 12, wherein the selected bit line is precharged with a third voltage.

14. The method of claim 13, wherein the second voltage is higher than the third voltage, and the first voltage is lower than the second voltage.

15. The method of claim 14, wherein the third voltage corresponds to a difference between the first voltage and a threshold voltage of the bit line selection transistor.

\* \* \* \* \*